(12) United States Patent
Niembro et al.

(10) Patent No.: US 11,223,097 B2
(45) Date of Patent: Jan. 11, 2022

(54) RADIOFREQUENCY TRANSMISSION LINE, DEVICE INCLUDING SUCH A TRANSMISSION LINE AND SYSTEM FOR MONITORING AN INSTALLATION INCLUDING SUCH A DEVICE

(71) Applicant: Schneider Electric Industries SAS, Rueil Malmaison (FR)

(72) Inventors: Alejandro Niembro, Grenoble (FR); Emmanuel Dreina, Meylan (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 8 days.

(21) Appl. No.: 16/749,715

(22) Filed: Jan. 22, 2020

(65) Prior Publication Data
US 2020/0266515 A1 Aug. 20, 2020

(30) Foreign Application Priority Data

Feb. 15, 2019 (FR) ...................................... 1901577

(51) Int. Cl.
*H01P 3/00* (2006.01)
*H01P 3/06* (2006.01)

(52) U.S. Cl.
CPC ................ *H01P 3/003* (2013.01); *H01P 3/06* (2013.01)

(58) Field of Classification Search
CPC ................................... H01P 3/003; H01P 3/06
See application file for complete search history.

(56) References Cited

U.S. PATENT DOCUMENTS

| | | | |
|---|---|---|---|
| 5,844,766 A | 12/1998 | Miglioli | |
| 6,522,220 B2 | 2/2003 | Yamada et al. | |
| 10,038,469 B1* | 7/2018 | Cordaro | H01Q 1/246 |
| 2011/0279943 A1 | 11/2011 | Penwell et al. | |
| 2015/0243608 A1* | 8/2015 | Yang | H01L 23/60 |
| | | | 361/56 |
| 2016/0380609 A1 | 12/2016 | Mazlouman et al. | |

OTHER PUBLICATIONS

Search Report and Written Opinion for French Patent Application No. FR1901577 dated Oct. 1, 2019, 7 pages.

\* cited by examiner

*Primary Examiner* — Samuel S Outten
(74) *Attorney, Agent, or Firm* — Locke Lord LLP

(57) ABSTRACT

A radiofrequency transmission line configured so as to allow a radiofrequency electrical signal to be transmitted between a first end and a second end, the transmission line including a main conductor and a ground plane electrically connected to an electrical ground of the transmission line. The ground plane includes a set of portions that are connected in series between the first end and the second end and a set of second capacitors, the set of portions including a set of second portions, each second capacitor being inserted between two contiguous second portions.

11 Claims, 4 Drawing Sheets

RADIOFREQUENCY TRANSMISSION LINE, DEVICE INCLUDING SUCH A TRANSMISSION LINE AND SYSTEM FOR MONITORING AN INSTALLATION INCLUDING SUCH A DEVICE

TECHNICAL FIELD

The present invention relates to a radiofrequency transmission line. The present invention also relates to a device including such a radiofrequency transmission line, together with a system for monitoring an installation including such a device.

BACKGROUND

Many devices comprise radiofrequency communications modules capable of exchanging data via electromagnetic waves having frequencies in the range between 1 Megahertz (MHz) and 100 Gigahertz (GHz). These devices generally comprise control modules capable of generating or of receiving a radiofrequency electrical signal, together with one or more antennas allowing the conversion of these electrical signals into electromagnetic waves and vice-versa.

Such devices are used in a large number of applications, and may be powered by a large number of different electrical sources, notably by simple connection to an electrical distribution network having a high voltage likely to present a risk for human beings. The electrical voltage delivered by an electrical source external to the device is generally adapted via an internal power supply circuit which then supplies the control module or control modules with a voltage, a current and, where necessary, a suitable frequency. In order to protect potential users from the electrical risks, the device generally comprises a housing for protection and electrical isolation enclosing the transformation circuit and the control module(s). These devices are generally integrated into electrical enclosures or panels which can block the radio waves.

In some cases, the housing forms an obstacle to the propagation of the electromagnetic waves emitted and/or received by the antenna. In other cases, the device is disposed in an installation comprising a housing or an envelope forming such an obstacle, or else in an installation installed in a location not allowing a radiofrequency signal to directly propagate as far as the device intended to receive this information, notably in the case of metal enclosures. In these cases, the antenna is disposed outside of the housing of the device or of the housing of the installation, or even remotely with respect to the installation at a place conducive to the propagation of radiofrequency waves. It is then necessary to provide a connector passing through a wall of the housing or of the enclosure and connecting the antenna to the control module(s). In order to protect the users against the risk of electrocution, the internal power supply circuit is provided so as to allow an isolation, notably a galvanic isolation, between the external current source and the control module. Thus, it is within the internal power supply circuit that the isolation takes place, such that all the elements situated downstream of the internal power supply circuit are isolated from the external source.

However, the internal power supply circuits allowing an isolation of the elements situated downstream with respect to the elements situated upstream are, in general, bulky and difficult to adapt, since they comprise transformers whose properties are fixed by the geometry and which are often designed specifically for certain applications.

There is accordingly a need for a radiofrequency device comprising an antenna and a power supply, which allows a good isolation of the antenna while having small dimensions.

SUMMARY

For this purpose, a radiofrequency transmission line is provided having a first end and a second end, the transmission line being configured so as to allow the transmission of a radiofrequency electrical signal between the first end and the second end, the transmission line including a main conductor and a ground plane electrically connected to an electrical ground of the transmission line, the main conductor including a set of portions connected in series between the first end and the second end and a set of first capacitors, the set of portions including a set of first portions, each first capacitor being inserted between two contiguous first portions, each first capacitor including a first electrode electrically connected to one of the first portions between which the first capacitor is inserted and a second electrode electrically connected to the other of the first portions between which the first capacitor is inserted, the ground plane including a set of portions connected in series between the first end and the second end and a set of second capacitors, the set of portions including a set of second portions, each second capacitor being inserted between two contiguous second portions, each second capacitor including a third electrode electrically connected to one of the second portions between which the second capacitor is inserted and a fourth electrode electrically connected to the other of the second portions between which the second capacitor is inserted.

Thanks to the invention, the two ends of the transmission line are effectively isolated from one another, notably for the electrical signals whose frequency is low, for example less than or equal to 10 kilohertz (kHz), while at the same time allowing the transmission of a radiofrequency electrical signal between these two ends. A device including a radiofrequency circuit including this transmission line is then able to comprise a non-isolated electrical power supply, the elements of the radiofrequency circuit which are situated outside of the housing then being isolated by the transmission line from the rest of the circuit, such that these elements may be touched without risk by an operator even if a part of the circuit is supplied with a voltage dangerous for humans. It is then possible to use, for this non-isolated part of the circuit, components, and notably an electrical power supply, with smaller dimensions than the components used in the prior art.

According to particular embodiments, the radiofrequency transmission line comprises one or more of the following features, taken alone or according to all the technically possible combinations:

- each first capacitor is configured for preventing the passage of an electrical current between the first electrode and the second electrode in the case of an electrical failure of the first capacitor and each second capacitor is configured for preventing the passage of an electrical current between the third electrode and the fourth electrode in the case of an electrical failure of the second capacitor;
- each first capacitor and each second capacitor has a capacitance greater than or equal to 10 picofarads, notably in the range between 10 picofarads and 4.7 nanofarads;
- the main conductor comprises, furthermore, at least two third portions and at least one third capacitor having a capacity less than or equal to 50 picofarads, the third capacitor being inserted between the two third portions and including a fifth electrode electrically connected to one of the third portions and a sixth electrode electrically connected to the other third portion;

the transmission line furthermore comprises at least one voltage clipping circuit configured for limiting, in absolute value, a difference of electrical potential between the main conductor and the ground plane;

each voltage clipping circuit comprises a first connection terminal electrically connected to a second portion of the main conductor and a second connection terminal electrically connected to the ground plane;

the transmission line comprises a substrate having two mounting faces, parallel to one another, each first capacitor of the main conductor being mounted on one of the mounting faces, each second capacitor of the ground plane being mounted on the other mounting face, each mounting face being perpendicular to a direction normal to the substrate, each first capacitor of the main conductor being aligned in the normal direction with a corresponding second capacitor of the ground plane.

A radiofrequency device is also provided including a radiofrequency transmission line such as previously described.

According to one particular embodiment, the radiofrequency device comprises a control module, an antenna connected to the control module via the radiofrequency transmission line and a power supply capable of receiving a first electrical voltage and of converting the first electrical voltage into a second electrical power supply voltage for the control module, the first electrical voltage being notably greater than or equal to 24 volts.

A system is also provided for monitoring an installation comprising a housing, the system comprising a radiofrequency device and a centralization device, the antenna being disposed outside of the housing, the control module being accommodated inside of the housing, the transmission line being configured for transmitting radiofrequency electrical signals between the control module and the antenna, the control module being configured for communicating with the centralization device by radiofrequency communications via the antenna.

BRIEF DESCRIPTION OF THE DRAWINGS

Various features and advantages of the invention will become clearly apparent upon reading the description that follows, given solely by way of non-limiting example, and presented with reference to the appended drawings, in which.

DETAILED DESCRIPTION

Figure 1:
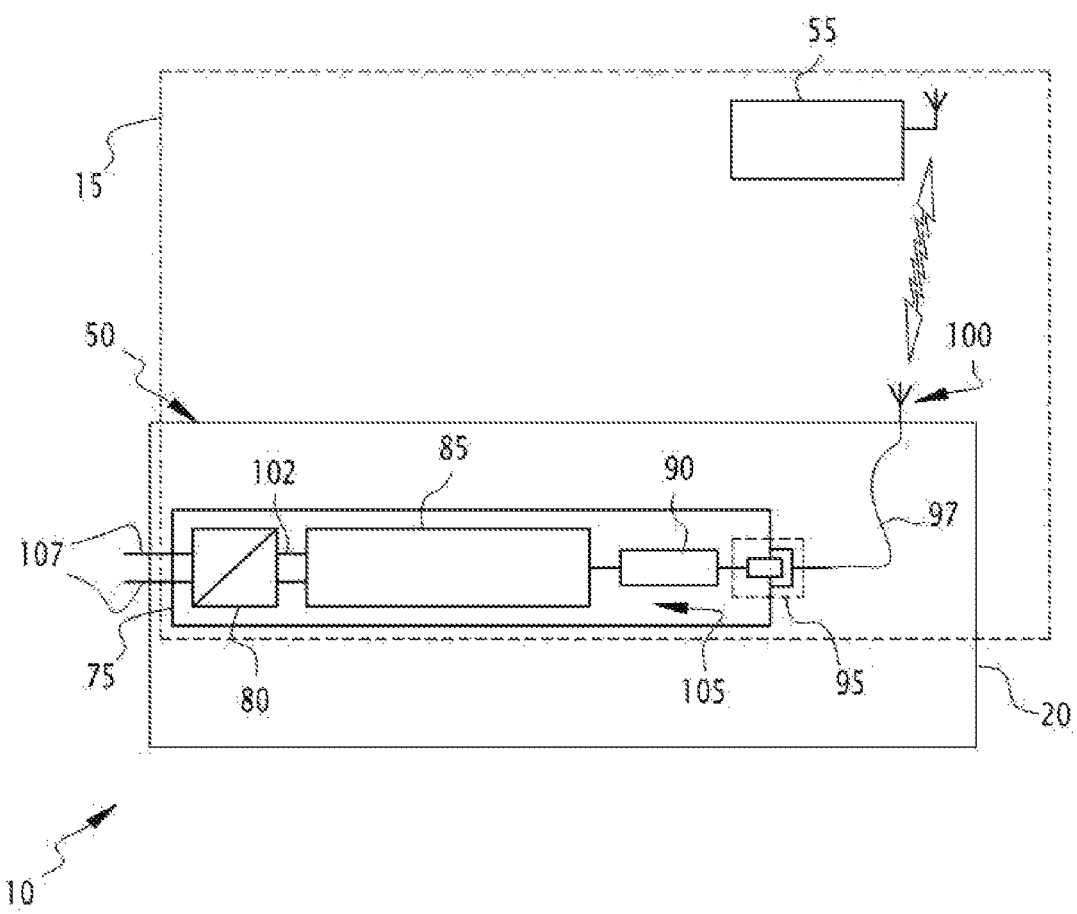
FIG. 1 is a schematic representation of an installation including a radiofrequency device including a radiofrequency transmission line.

An installation 10 and a system 15 for controlling the installation are partially shown in FIG. 1.

The installation 10 is, for example, an electrical installation including a set of electrical conductors and, optionally, one or more functional mechanisms. For example, the installation 10 is an electrical enclosure, a lamp post, a wind-turbine mast, or else a transformer station. However, other types of electrical installations 10 could be envisaged.

Each functional mechanism is, for example, a device supplied via the conductors, or else a device capable of modifying an electrical current or voltage on the conductors such as a switch or a transformer.

The installation 10 comprises a housing 20.

The housing 20 bounds an internal volume Vi of the housing.

The housing 20 is designed to isolate the internal volume Vi of the housing from the outside of the housing 20. This notably means that the housing 20 is able to prevent an unauthorized person from accessing the internal volume Vi. This also means that the housing 20 is configured for preventing the flow of an electrical current from the internal volume Vi to outside of the housing 20, and vice-versa.

For example, the housing 20 comprises four concrete walls and a roof. As a variant, the housing 20 is constructed, at least partially, for example completely, of a metal material.

The housing 20 is, for example, electrically connected to the earth.

The control system 15 comprises a radiofrequency device 50 and a centralization device 55.

The term "control system" is notably understood to mean that the control system 15 is configured to allow an exchange of data relating to the installation 10 between the installation 10 and a location remote from the installation 10.

According to one embodiment, the control system 15 is configured for transmitting data from the installation 10 to the remote location or vice-versa.

The data that the control system 15 is configured to transmit could be of any nature. For example, the data comprises a command destined for a functional mechanism of the installation 10, a value or a set of values of parameters of the installation 10, or else the result of a calculation performed by a functional mechanism of the installation 10.

The radiofrequency device 50 is configured for generating and/or receiving and/or processing data in the form of electrical signals or of radiofrequency electromagnetic waves. In particular, the radiofrequency device 50 is configured for exchanging data with the centralization device 55 in the form of radiofrequency electromagnetic waves. The radiofrequency device 50 is capable, furthermore, of fulfilling a large number of additional functions.

The radiofrequency device 50 is, for example, provided for playing the role of a gateway or of a hub between one or more devices received within the internal volume Vi of the housing 20 and the centralization device 55. In particular, the radiofrequency device 50 is provided for receiving data from the device or from devices received within the internal volume Vi of the housing 20 and for transmitting this data to the centralization device 55, or else for receiving data from the centralization device 55 and for transmitting this data to the device(s) received within the internal volume Vi of the housing 20.

According to another variant, the radiofrequency device 50 is itself configured for generating data and for transmitting this data to the centralization device 55. For example, the radiofrequency device 50 comprises at least one sensor configured for measuring values of parameters of the installation 10, and for transmitting the measured values to the centralization device 55.

According to yet another a variant, the radiofrequency device 50 is configured for receiving from the centralization device 55, via radiofrequency communications, a message for modifying a state of a functional mechanism of the installation 10, for example a message for switching the functional mechanism between two states.

According to one additional variant, the radiofrequency device 50 comprises at least one functional mechanism capable of modifying a parameter of the installation 10, for example able to switch between a position allowing the passage of an electrical current between two conductors and a position preventing the passage of current between these conductors. In particular, the device 50 is a relay.

The radiofrequency device 50 comprises a housing 75, an electrical power supply 80, a control module 85, a radiofrequency transmission line 90, a connector 95, an optional transmission cable 97 and a first antenna 100.

The housing 75 bounds a chamber 105 accommodating the electrical power supply 80, the control module 85 and the transmission line 90.

The housing 75 is configured for electrically isolating the interior of the chamber 105 from the outside of the housing 75.

The housing 75 is constructed of an electrically-insulating material. For example, the housing 75 is made of plastic.

The housing 75 is accommodated within the internal volume Vi of the housing 20.

The electrical power supply 80 is, for example, capable of receiving a first electrical current exhibiting an electrical voltage U1. The electrical voltage U1 is, for example, a DC or AC voltage presenting a risk for persons, for example a value of voltage greater than or equal to 24V volts (V).

Figure 2:
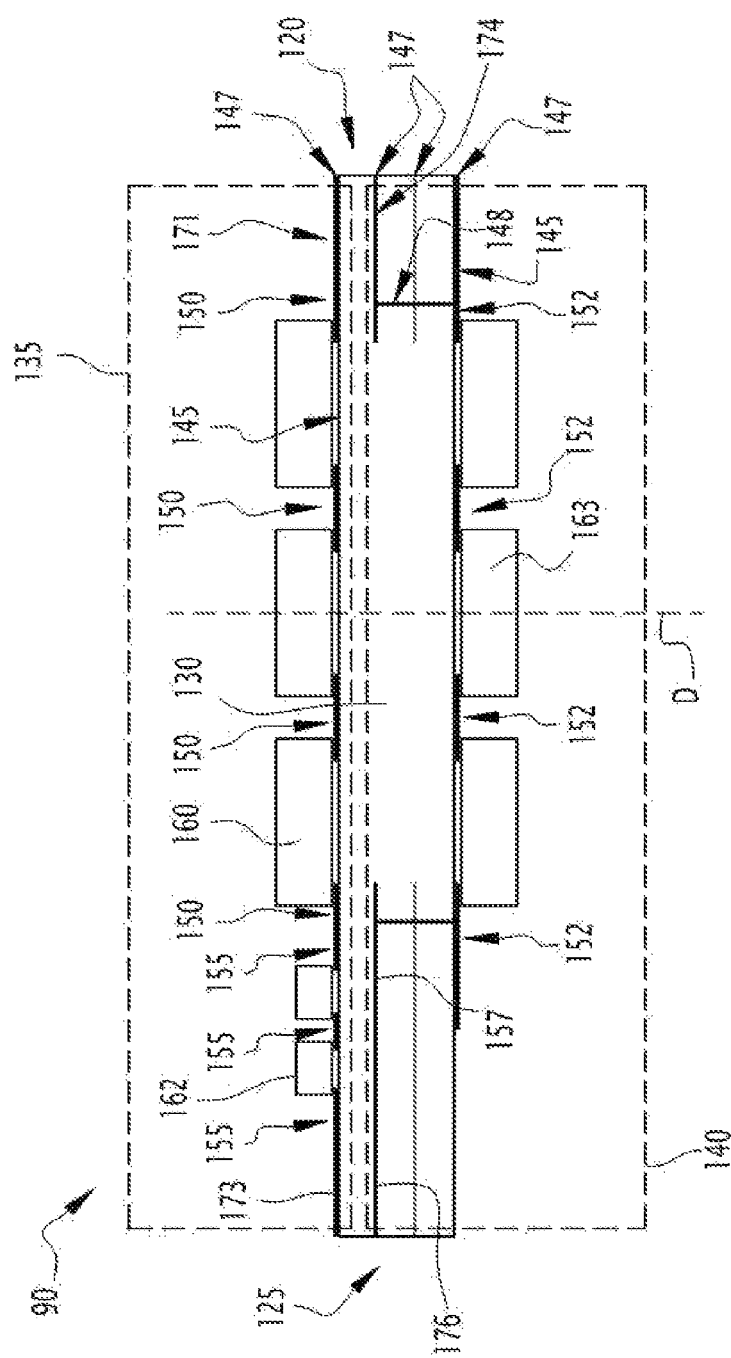
FIG. 2 is a partial schematic cross-sectional representation of the transmission line in FIG. 1.

According to the example shown in FIG. 2, the power supply 80 is able to receive the first electrical current via input conductors 107 passing through a wall of the housing 75.

The electrical power supply 80 is configured for electrically powering the control module 85 with a second electrical current. The electrical power supply 80 is, notably, electrically connected to the control module 85 by output electrical conductors 102.

The second electrical current exhibits an electrical voltage U2. The electrical voltage delivered by the electrical power supply 80 is, for example, a DC voltage.

The electrical voltage U2 is strictly less than the electrical voltage U1 received by the electrical power supply 80. For example, the electrical voltage U2 has a voltage value less than or equal to 12 V, notably equal to 12V, or else equal to 5 V.

The electrical power supply 80 is therefore capable of converting the electrical voltage U1 into the electrical voltage U2.

The electrical power supply 80 is, according to one embodiment, a non-isolated power supply. In particular, at least one of the output conductors 102 is electrically connected to one of the input conductors 107. According to one embodiment, an output conductor 102 playing the role of neutral for the second current is electrically connected to an input conductor 107 playing this same role for the first current.

The control module 85 is configured for processing data in the form of electrical signals.

For example, the control module 85 is configured for generating a radiofrequency message able to be transmitted via the first antenna 100 to the centralization device 55. In particular, the control module 85 is configured for receiving data and for generating the radiofrequency message from the received data.

The data from which the radiofrequency message is generated could be of any nature.

According to one variant, the control module 85 is configured for receiving a radiofrequency message from the centralization device 55 via the first antenna 100, and for extracting data from the radiofrequency message, where this data could be of any nature.

For example, the control module 85 is configured for extracting from the radiofrequency message a command destined for a functional mechanism external to the control module 85 and for transmitting the command to this functional mechanism.

The radiofrequency message that the control module 85 is configured for transmitting and/or receiving comprises an electrical radiofrequency signal.

The transmission line 90 is configured for transmitting radiofrequency electrical signals between the control module 85 and the connector 90.

The term "radiofrequency electrical signal" is notably understood to mean a variable electrical signal having at least one frequency in the range between 1 MHz and 10 GHz. An electrical signal exhibiting a current varying with a frequency in the range between 1 MHz and 10 GHz is one example of a radiofrequency electrical signal. An electrical signal exhibiting a voltage varying with a frequency in the range between 1 MHz and 10 GHz is another example of a radiofrequency electrical signal.

The transmission line 90 is shown in cross-section in FIG. 2.

The transmission line 90 has a first end 120 and a second end 125. The transmission line 90 is configured for transmitting the radiofrequency electrical signal between the first end 120 and the second end 125, and vice-versa.

The first end 120 is, for example, connected to the connector 95, whereas the second end 125 is connected to the control module 85.

Figure 3:
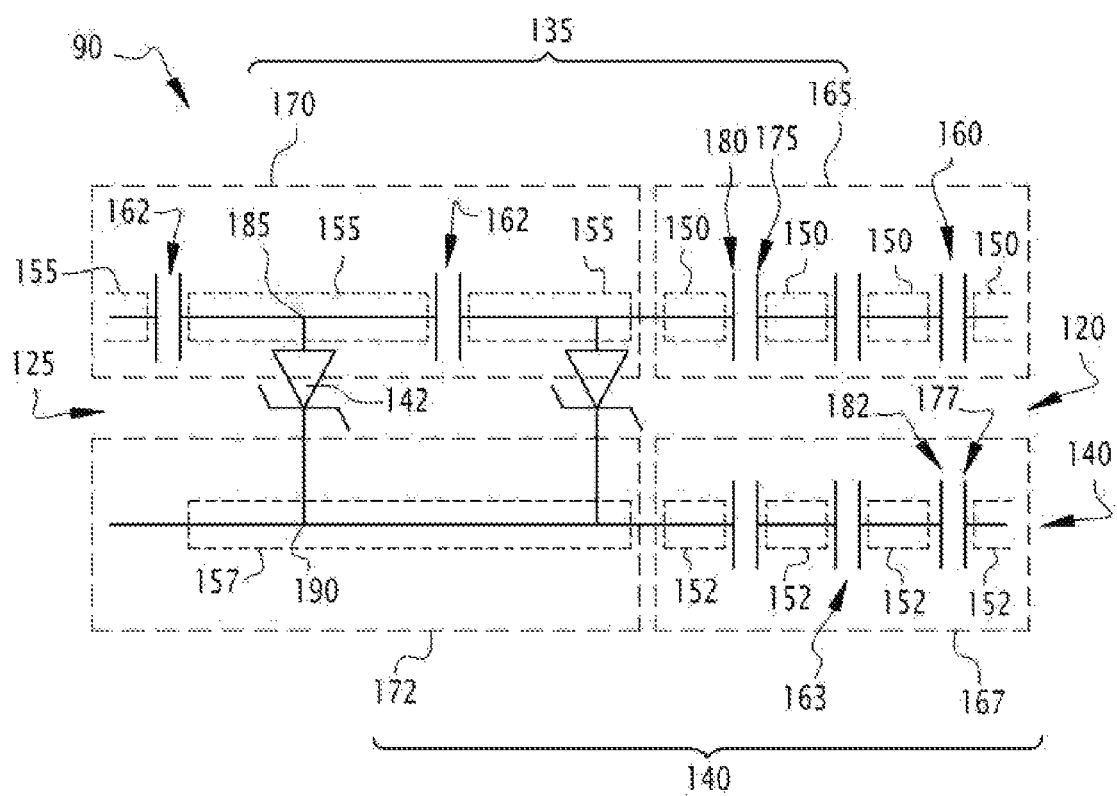
FIG. 3 is a partial electrical circuit diagram of the transmission line in FIG. 2.

The transmission line 90 comprises a substrate 130, a main conductor 135, and a ground plane 140. According to one particular embodiment, the transmission line 90 furthermore comprises at least one voltage clipping circuit 142, which is shown in FIG. 3.

The substrate 130 has two mounting faces 145. Each mounting face 145 is, for example, plane.

The substrate 130 is made from an electrically-insulating material, for example a plastic, or else from a composite material such as a resin comprising reinforcing fibres, notably glass fibres.

The substrate 130 is, notably, a printed circuit board on which the conductor 135 and the ground plane 140 are at least partially formed by a layer of metal such as copper lying on certain portions of the mounting faces 145.

The mounting faces 145 are, for example, parallel to one another.

According to one embodiment, several levels 147 of layers stacked in the normal direction D are defined for the substrate 130.

The substrate 130 is, for example, obtained by bonding of plates each carrying on at least one of their faces a layer of a metal material. The layers are formed so as to define conducting portions, for example locally removing the metal material so as to only leave the desired conducting portions remaining.

The conducting portions belonging to separate layer levels 147 are connected to one another by conducting vias 148 connecting layer levels and extending in the normal direction D.

According to the example shown in FIG. 3, the support 130 comprises four layer levels 147, however the number of levels could vary. In particular, two of the levels 147, called "external layers" are lying on the mounting faces 145, the two other levels, called "internal layers" being buried in the support 130. According to one variant that may be envisaged, the support 130 only comprises two layer levels 147 lying on the mounting faces 145.

A normal direction D is defined for the substrate 130. Each mounting face 145 is, for example, perpendicular to the normal direction D. For example, a distance, in the normal direction D, between two successive levels 147, is constant for any pair of two successive levels 147.

The main conductor 135 and the ground plane 140 are facing one another. In particular, the main conductor 135 and the ground plane 140 are aligned in the main direction D.

The main conductor 135 is lying on the substrate 130. For example, the main conductor 135 is lying on a mounting face 145 of the substrate 130.

The main conductor 135 comprises a first part 165 and, optionally, a second part 170. The first part 165 is, for example, bounded by the first end 120 and by the second part 170, the second part 170 then being bounded by the second end 125 and by the first part 165. However, variants according to which the first part 165 is bounded by the second end 125 and by the second part 170, the second part 170 then being bounded by the first end 120 and by the first part 165, may also be envisaged.

In one variant where no second part 170 is present, the first part 165 is then bounded by the first end 120 and by the second end 125.

The first part 165 comprises a set of first portions 150, a set of first capacitors 160 and a first end portion 171. The first part 165 is designed to transmit the electrical signal between the first end 120 and the second part 170.

The second part 170 comprises a set of second portions 155, a set of second capacitors 162 and a second end portion 173.

Each first or second portion 150, 155, together with each first or second end portion 171, 173 takes, for example, the form of a conducting film lying on the substrate 130. In particular, each portion 150, 155, 171, 173 is made of a metal material such as copper.

Each first or second portion 150, 155 together with each first or second end portion 171, 173 is, notably, a portion of a metal layer level 147 lying on one of the mounting faces 145.

The first portions 150 of the main conductor 135 are connected in series. In particular, no second portion 155 is inserted between two first portions 150 and no first portion 150 is inserted between two second portions 155.

One of the first portions 150 is electrically connected to the first end portion 171, another first portion 150 being electrically connected to one of the second portions 155, the other first portions 150 being connected in series between the first portion 150 electrically connected to the first end portion 171 and the first portion 150 electrically connected to one of the second portions 155.

The first portion 150 electrically connected to the first end portion 171 is, notably, made from the same material as this first end portion 171. The first portion 150 electrically connected to one of the second portions 155 is, notably, made from the same material as this second portion 155.

A width is defined for each portion 150, 155, 171, 173. The width is measured in a plane perpendicular to the normal direction D, in a direction perpendicular to the direction in which the electrical signal is propagating in the first portion 150.

According to one embodiment, the first portions 150 are aligned in a main direction DP, as shown in FIG. 3. The main direction DP is perpendicular to the normal direction D.

Each first portion 150 is, for example, rectangular, each side of the rectangle being either perpendicular or parallel to the main direction DP. In this case, the width is measured between the two sides parallel to the main direction DP. It should be noted that the form of each first portion 150 could vary.

The width of each first portion 150 depends on the line impedance, on the thickness and the permittivity of the substrate; it is, for example, in the range between 0.1 millimetre (mm) and 10 mm. However, the width of each first portion 150 could vary.

The first end portion 171 connects the corresponding first portion 150 to the first end 120. For example, the first end portion 171 is electrically connected to the connector 95.

The first end portion 171 has, for example, a width strictly less than the width of the first portions 150. In particular, the width of the first end portion 171 is equal to one third of the width of the first portions 150. However, the width of the first end portion 171 could vary.

A first capacitor 160 is inserted between each pair of contiguous first portions 150. For example, each first capacitor 160 comprises a first electrode 175 and a second electrode 180, the first electrode 175 being electrically connected to a first portion 150 and the second electrode 180 being connected to another first portion 150, this other first portion 150 being notably itself connected to the first electrode 175 of another first capacitor 160 whose second electrode 180 is connected to yet another first portion 150. Thus, the first portions 150 of each pair of contiguous first portions 150 are connected in series via a first capacitor 160 inserted between the two first portions 150 in question.

Figure 4:
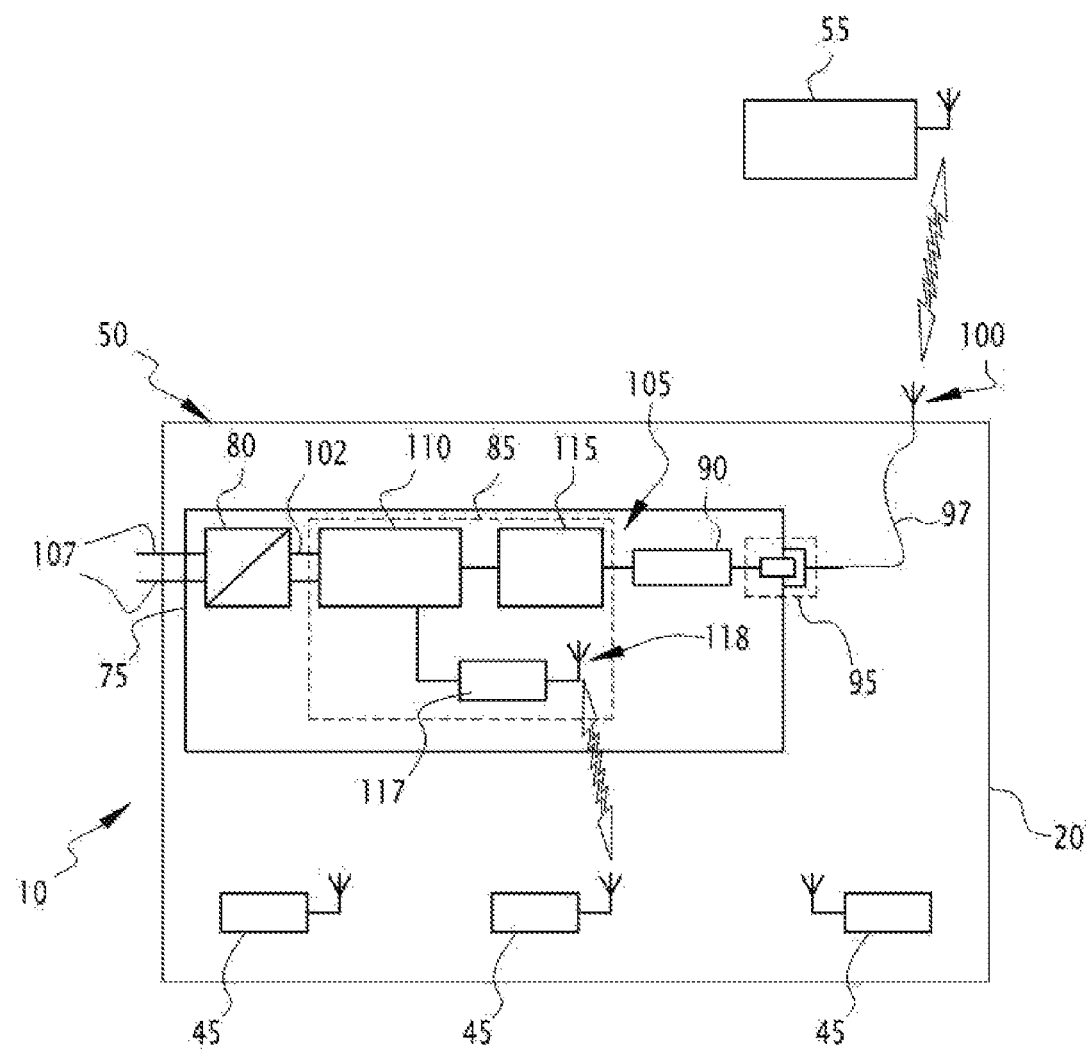
FIG. 4 is a schematic representation of a specific embodiment of the installation in FIG. 1.

According to the example shown in FIGS. 3 and 4, the main conductor 135 comprises four first portions 150 and three first capacitors 160. However, it should be noted that the number of first portions 150 and of first capacitors 160 could vary.

The number of second portions 155 is, for example, three. However, their number could vary.

The second portions 155 of the main conductor 135 are connected in series.

In the embodiment shown in the FIGS. 2 and 3, one of the second portions 155 is electrically connected with the second end portion 173. The other second portions 155 are connected in series between the second portion 155 made from the same material as the second end portion 173 and that of the second portions 155 which is electrically connected to one of the first portions 150. The second end portion 173 connects the corresponding second portion 155 to the second end 125. In particular, the second end portion 173 is electrically connected to the control module 85. However, other configurations may be envisaged.

Each first capacitor 160 has a capacitance greater than or equal, for example, to 10 picofarad (pF), notably in the range between 10 pF and 4.7 nanofarad (nF).

Each first capacitor 160 is, for example, a safety capacitor provided to prevent the passage of an electrical current between the first electrode 175 and the second electrode 180 in the case of an electrical failure of the capacitor 160. More precisely, the first capacitor 160 is provided so that, in the case of an electrical failure of the capacitor 160, notably caused by an over-voltage, the first electrode 175 remains at a distance from the second electrode 180. In other words, in the case of an electrical failure of the capacitor 160, the first electrode 175 does not form a short-circuit with the second electrode 180.

In particular, each first capacitor 160 is a class-Y capacitor provided to operate at a voltage of less than 500 V, notably in the range between 150V and 300V, and for a maximum voltage in the case of a voltage spike of less than 8000 V, notably less than 5000 V. Class Y is notably defined by the standard EN 60384-14.

The ground plane 140 is, notably, such that, when an electrical signal is propagating in the transmission line 90, field lines which appear between the main conductor 135 and the ground plane 140 tend to direct electrons in the direction of the ground plane 140.

The ground plane 140 is, for example, connected to an electrical ground of the transmission line 90. However, other embodiments may be envisaged in which the ground plane 140 is not connected to such an electrical ground.

The ground plane 140 is lying on the substrate 130. For example, the ground plane 140 is lying, at least partially, on a mounting face 145 opposite to the mounting face 145 carrying the main conductor 135.

The ground plane 140 comprises a set of portions and a set of third capacitors 163.

The set of portions of the ground plane 140 comprises a set of third portions 152, a fourth portion 157, an third end portion 174 and a fourth end portion 176.

Each third or fourth portion 152, 157, together with the third and fourth end portions 174, 176, takes, for example, the form of a conducting film lying on the substrate 130. In particular, each portion 152, 157, 174, 176 is made of a metal material such as copper.

The third portions 152 are connected in series. In particular, no fourth portion 157 is inserted between two third portions 152.

Notably, the ground plane 140 comprises a third part 167 and a fourth part 172, the third part 167 being bounded by the first end 120 and by the fourth part 172, the fourth part 172 being bounded by the second end 125 and by the third part 167. Each third portion 152 is a portion of the third part 167, the fourth portion 157 being a portion of the fourth part 172.

Each third portion 152 is, for example, a portion of an external layer level 147. According to the embodiment shown in FIG. 2, each third portion 152 is lying on the mounting face 145 opposite to the mounting face 145 carrying the first portions 150. However, other embodiments in which each third portion 152 is a portion of an internal layer level 147 may also be envisaged.

One of the third portions 152 is electrically connected to the third end portion 174, another third portion 152 being electrically connected to the fourth portion 157, the other third portions 152 being connected in series between the third portion 152 electrically connected to the third end portion 174 and the third portion 152 electrically connected to one of the fourth portions 157.

The third portion 152 electrically connected to the third end portion 174 is, notably, made from the same material as this third end portion 174. The third portion 152 electrically connected to the fourth portion 157 is, notably, made from the same material as this fourth portion 157.

A width is defined for each portion 152, 157, 174, 176. The width is measured in a plane perpendicular to the normal direction D, in a direction perpendicular to the direction in which the electrical signal is propagating in the first portion 150.

According to one embodiment, the third portions 152 are aligned in the main direction DP, as shown in FIG. 3.

Each third portion 152 is, for example, rectangular, each side of the rectangle being either perpendicular or parallel to the main direction DP. In this case, the width is measured between the two sides parallel to the main direction DP.

The width of each third portion 152 is, for example, in the range between 0.5 millimetre (mm) and 50 mm. In particular, the width of each third portion 152 is greater than or equal to the width of the first portions 150, notably greater than or equal to 5 times the width of the first portions 150.

Each third portion 152 is, for example, disposed facing a corresponding first portion 150. In particular, each third portion 152 is aligned with the corresponding first portion 150 in the normal direction D. However, other embodiments in which the third portions 152 are not aligned with the first portions 150 may also be envisaged.

The fourth portion 157 is facing each second portion 155. The fourth portion 155 has a width greater than or equal to 5 times the width of the second portions 155.

A distance between the fourth portion 157 and the second portions 155, measured in the normal direction D is, for example, less than, notably strictly less than, a distance in this same direction D between the first portions 150 and the third portions 152.

The fourth portion 157 is, notably, a portion of an internal layer 147. In particular, the fourth portion 157 belongs to the metal layer level 147 closest to the layer level 147 to which the second portions 155 belong. However, embodiments in which the fourth portions 157 are portions of an external layer 147 may also be envisaged.

The fourth portion 157 is inserted between that of the third portions 152 which is electrically connected to the fourth portion 157 and the fourth end portion 176.

The fourth portion 157 is, for example, electrically connected to the corresponding third portion 152 by a via 148 passing partially through the carrier 130 in the normal direction D.

The fourth portion 157 is electrically connected to, notably made from the same material as, the fourth end portion 176.

The third end portion 174 connects the corresponding third portion 152 to the first end 120. For example, the first third end portion 174 is electrically connected to the connector 95.

The third end portion 174 has a width greater than or equal to 5 times the width of the first end portion 171.

The third end portion 174 is, for example, a portion of an internal layer 147. In particular, the third end portion 174 belongs to the metal layer levels 147 closest to the metal layer levels 147 carrying the first end portion 171.

The third end portion 174 is, for example, electrically connected to the corresponding third portion 152 by a via 148 passing partially through the carrier 130 in the normal direction D.

The fourth end portion 176 connects the fourth portion 157 to the second end 125. The fourth end portion 176 is, for example, electrically connected to the control module 85.

The fourth end portion 176 is facing the second end portion 173.

The fourth end portion 176 is, for example, a portion of an internal layer 147. In particular, the fourth end portion 176 belongs to the metal layer levels 147 closest to the level 147 carrying the second end portion 173.

A third capacitor 163 is inserted between each pair of contiguous third portions 152. For example, each third capacitor 163 comprises a third electrode 177 and a fourth electrode 182, the third electrode 177 being electrically connected to a third portion 152 and the fourth electrode 182 being connected to another third portion 152, this other first portion 150 being itself notably connected to the third electrode 177 of another third capacitor 163 whose fourth electrode 182 is connected to yet another third portion 152. Thus, the third portions 152 of each pair of contiguous third portions 152 are connected in series via a third capacitor 163 inserted between the two third portions 152 in question.

According to the example shown in FIGS. 3 and 4, the ground plane 140 comprises four third portions 152 and three third capacitors 163. However, It should be noted that the number of third portions 152 and of third capacitors 163 could vary.

Each third capacitor 163 has a capacitance greater than or equal for example to 10 pF, notably in the range between 10 pF and 4.7 nF.

Each third capacitor 163 is, for example, a safety capacitor provided to prevent the passage of an electrical current between the third electrode 177 and the fourth electrode 182 in the case of an electrical failure of the capacitor 163. More precisely, the third capacitor 163 is provided so that, in the case of an electrical failure of the third capacitor 163, notably caused by an over-voltage, the third electrode 177 remains at a distance from the fourth electrode 182. In other words, in the case of an electrical failure of the capacitor 163, the first electrode 177 does not form a short-circuit with the second electrode 182.

In particular, each third capacitor 163 is a Y-class capacitor.

Each third capacitor 163 is, for example, lying on a mounting face 145 of the substrate. In particular, each first capacitor 160 of the main conductor 135 is lying on one of the mounting faces 145, whereas each third capacitor 163 of the ground plane 140 is lying on the other mounting face 145.

According to one embodiment, each first capacitor 160 lying on one of the mounting faces 145 is aligned in the normal direction D with a third capacitor 163 lying on the other mounting face 145, as shown in FIG. 3. It should be noted that embodiments in which the first capacitors 160 lying on the two mounting faces 145 are not aligned in pairs with the third capacitors 163 in the normal direction D may also be envisaged.

Each second capacitor 162 is inserted between two second portions 155. In particular, each second capacitor 162 comprises two electrodes each connected to one of the two second portions 155 between which the second capacitor 162 is inserted.

According to the embodiment shown in the FIGS. 3 and 4, the main conductor 135 comprises three second portions 155 and two second capacitors 162. However, the number of second portions 155 and of second capacitors 162 could vary.

A capacitance is defined for each second capacitor 162. The capacitance of each second capacitor 162 is less than or equal to 50 picofarads (pF), for example in the range between 1 pF and 20 pF.

Each voltage clipping circuit 142 is inserted between the main conductor 135 and the ground plane 140. In particular, each voltage clipping circuit 142 comprises a connection terminal 185 electrically connected to the main conductor 135 and a connection terminal 190 electrically connected to the ground plane 140.

Each voltage clipping circuit 142 is, notably electrically connected to a second portion 155 of the main conductor 135 and to the fourth portion 157 of the ground plane 140.

Each voltage clipping circuit 142 is configured for limiting a difference in electrical potential between the main conductor 135 and the ground plane 140, notably between the second portion 155 and the fourth portion 157 to which the voltage clipping circuit 142 is electrically connected.

In particular, each voltage clipping circuit 142 is designed to prevent a difference in electrical potential between the main conductor 135 and the ground plane 140 from exceeding a predetermined value. The predetermined value is, for example, 30 kV for discharge in air and 25 kV for discharge on contact according to the standard IEC61000-4-2.

Voltage clipping circuits 142 of different types are able to be used for limiting the electrical voltage between the main conductor 135 and the ground plane 140.

Each voltage clipping circuit 142 comprises, for example, one or more diodes connecting the main conductor 135 and the ground plane 142. Each diode has, in particular, a low capacitance, for example less than or equal to 1 pF, notably in the range between 0.1 pF and 0.5 pF.

According to the example in FIG. 4, each second capacitor 162 is associated with a voltage clipping circuit 142 electrically connected to one of the second portions 155 to which the second capacitor 162 is connected. In particular, at least one second capacitor 162 is inserted between two second portions 155 each electrically connected to a corresponding voltage clipping circuit 142.

The connector 95 passes through a wall of the housing 75. The connector 95 is configured to allow the transmission of a radiofrequency electrical signal between the interior of the housing 75 and the exterior of the housing 75, notably between the radiofrequency transmission line 90 and the first antenna 100.

The connector 95 may be chosen from amongst a large number of connectors 95. According to one embodiment, the connector 90 is a coaxial connector comprising a central conductor surrounded by a cylindrical conductor, the conductor central being connected to the main conductor 135, notably to the first end portion 171 and the cylindrical conductor being connected to the ground plane 140, notably to the third end portion 174.

SMA (for "SubMiniature version A") connectors are one example of connectors 95 that may be envisaged.

The cable 97 is configured for transmitting the electrical signal between the connector 95 and the first antenna 100. The cable 97 is, for example, a coaxial cable, but other types of cables 97 could be envisaged.

The first antenna 100 is connected to the control module 85 via at least the transmission line 90. In particular, the first antenna 100 is connected to the control module 85 via the transmission line 90, the connector 95 and, if such a cable 97 is present, via the cable 97.

The first antenna 100 is disposed outside of the housing 75. In particular, the first antenna 100 is disposed outside of the housing 30, notably fixed onto an external face of the housing 30.

The first antenna 100 is designed to convert the radiofrequency electrical signal into a radiofrequency electromagnetic wave and vice-versa. In particular, the first antenna 100 is able to generate the radiofrequency message from the electrical signal generated by the control module 85 and transmitted to the first antenna 100 through the transmission line 90, the connector 95 and, optionally, the cable 97.

The first antenna 100 is, for example, electrically connected to the cable 97. However, if no cable 97 is present, the first antenna 100 is then connected directly to the connector 95.

The first antenna 100 can be chosen from amongst a large number of different types of antennas 100.

The centralization device 55 is, for example, able to receive the data generated by the radiofrequency device 50 via radiofrequency communications.

The centralization device 55 is, for example, able to display the data, in part or in its entirety, on a human-machine interface such as a screen, for the attention of an operator.

As a variant, the centralization device 55 is configured for transmitting the data via radiofrequency communications to the radiofrequency device 50.

By virtue of the first capacitors 160, the first end 120 and the second end 125 are efficiently isolated from one another in such a manner as to avoid the risk of electrocution of an operator touching the first antenna 100 or the exposed part of the connector 90, while at the same time allowing the transmission of radiofrequency electrical signals between the two ends of the transmission line 90.

In particular, owing to their high capacitance, the first capacitors 160 behave as electrical conductors at radio frequencies, but prevent a voltage with a low frequency, notably a frequency less than or equal to 10 kHz, in particular a DC voltage, from propagating between the two ends 120, 125 of the transmission line 90.

This transmission line 90 notably allows the connector 95 to be isolated against the over-voltages of the electrical power network supplying the first current to the power supply 85.

Furthermore, the desired level of isolation is readily adapted by modifying the number of first capacitors 160, notably as a function of the electrical voltage U2 with which the power supply 80 is powered.

A device 50 equipped with this transmission line 90 is able to comprise a non-isolated electrical power supply 80, since it is the transmission line 90 that allows the isolation of the external parts of the device 50. It is then possible to use, for the part of the device 50 situated upstream of the transmission line, components, and notably an electrical power supply 80, with smaller dimensions than the components used in the prior art.

The presence of the second capacitors 162 prevents reflections of the electrical signal caused by the propagation of the electrical signal in the cable 97 from causing high-voltage interference detrimental to the quality of the electrical signal, by cutting the low-frequency signals.

It should be noted that, when the radiofrequency device 50 does not comprise a cable 97, the second part 170 could be absent.

The voltage clipping circuits 142 allow a protection against electrostatic discharges, fast transients and lightening.

When the first capacitors 160 lying on the two mounting faces 145 are aligned in pairs in the normal direction D, the transmission line 90 obtained is particularly compact.

The separation of the first portions 150 and of the second portions 155 into two separate parts 170 and 175 of the conductors 135, 140 prevents too many breakdowns of impedance from one portion to the other from causing excessive losses during the transmission of the signal in the transmission line 90.

In FIG. 4, one specific embodiment of the control system 15 is shown by way of illustration.

The control system 15 comprises at least one sensor 45, for example a set of sensors 45. It should be noted that the number of sensors 45 could vary.

Each sensor 45 is designed to measure a value of a quantity associated with the internal volume Vi of the housing 20.

For example, the sensor 45 is designed to measure a value representative of an electrical current flowing in an electrical conductor of the installation 10, the conductor being accommodated at least partially within the internal volume Vi of the housing 20. The value is, for example, a value of a voltage or of an intensity of the electrical current.

As a variant, the sensor 45 is designed to measure a value of a thermodynamic quantity of the internal volume Vi. For example, the sensor 45 is designed to measure values of temperature, or else values of level of humidity within the internal volume Vi.

According to one variant, at least one sensor 45 is configured for measuring a value of a parameter of a functional mechanism of the installation 10.

It should be noted that other types of sensors 45 configured for measuring values of parameters other than those previously detailed may also be envisaged.

Each sensor 45 is configured so as to deliver the measured values to the radiofrequency device 50. In particular, each sensor 45 is configured for generating a measurement message containing the measured values and for transmitting the measurement message to the radiofrequency device 50.

For example, the sensor 45 is capable of transmitting the measured values to the radiofrequency device 50 via radiofrequency communications. According to one embodiment, the sensor 45 is configured for transmitting the measured values to the radiofrequency device 50 via a protocol of the ZigBee or WiFi type over a frequency band close to 2450 MHz.

As a variant, the sensor 45 is able to communicate with the radiofrequency device 50 via wired link. Preferably, the sensor 45 is then electrically isolated, for example galvanically, from the radiofrequency device 50. As an optional complement, when the sensor 45 is configured for measuring values of parameters of an electrically-powered device of the installation 10, the sensor 45 is galvanically isolated from this device.

The radiofrequency device 50 is, for example, configured for receiving the measured values from the sensors 45 and for transmitting the measured values to the centralization device 55 via radiofrequency communications. In this case, the radiofrequency device 50 plays the role of gateway or of hub between the sensors 45 and the centralization device 55.

In particular, the control module 85 is, for example, configured for receiving the values measured by the sensors 45 and for generating a radiofrequency message comprising the measured values destined for the centralization device 55.

According to one particular embodiment, the control module 85 is, furthermore, configured for generating operating data from the measured values and for inserting the operating data into the radiofrequency message.

The control module 85 comprises, for example, a data processing unit 110, a first radiofrequency communications module 115, a second radiofrequency communications module 117 and a second antenna 118.

The data processing unit 110 is designed to convert data such as the values measured by the sensors 45 into a data message including the measured values and/or the operating data.

The first radiofrequency communications module 115 is configured for receiving the data message, for converting the data message into a radiofrequency electrical signal able to be transformed into a radiofrequency message by the first antenna 100.

The second radiofrequency communications module 117 is configured for receiving the values measured by the sensors 45 via the second antenna 118, and for transmitting these measured values to the data processing unit 110.

Each of the radiofrequency communications modules 115, 117 and/or the data processing unit 110 take, for example, the form of a programmable logic component, of a dedicated integrated circuit, or else of a set of software instructions forming the radiofrequency communications modules 115, 117 and/or the data processing unit 110 when the software instructions are executed on a microcontroller of the control module 85.

It should be noted that, according to one variant that may be envisaged, at least one sensor 45 is integrated into the radiofrequency device 50, for example accommodated within the housing 75. In this case, the sensor 45 is for example connected to the control module 85 via a wired link, without requiring the second radiofrequency communications module 117 and the second antenna 118.

The invention claimed is:

1. A radiofrequency transmission line having a first end and a second end, the transmission line being configured so as to allow the transmission of a radiofrequency electrical signal between the first end and the second end, the transmission line including a main conductor and a ground plane electrically connected to an electrical ground of the transmission line, the main conductor including a set of portions connected in series between the first end and the second end and a set of first capacitors, the set of portions including a set of first portions, each first capacitor being inserted between two contiguous first portions, each first capacitor including a first electrode electrically connected to one of the first portions between which each first capacitor is inserted and a second electrode electrically connected to the other of the first portions between which each first capacitor is inserted, wherein the ground plane comprises a set of portions connected in series between the first end and the second end and a set of second capacitors, the set of portions including a set of second portions, each second capacitor being inserted between two contiguous second portions, each second capacitor including a third electrode electrically connected to one of the second portions between which each second capacitor is inserted and a fourth electrode electrically connected to the other of the second portions between which each second capacitor is inserted, and wherein each first capacitor is configured for preventing the passage of an electrical current between the first electrode and the second electrode in the case of an electrical failure of said each first capacitor and each second capacitor is configured for preventing the passage of an electrical current between the third electrode and the fourth electrode in the case of an electrical failure of said each second capacitor.

2. A radiofrequency device comprising a radiofrequency transmission line according to claim 1.

3. The radiofrequency device according to claim 2, comprising a control module, an antenna connected to the control module via the radiofrequency transmission line and a power supply able to receive a first electrical voltage and to convert the first electrical voltage into a second electrical voltage supplying the control module.

4. A system for monitoring an installation comprising a housing, the system comprising a radiofrequency device according to claim 3 and a centralization device, the antenna being disposed outside of the housing, the control module being accommodated inside the housing, the transmission line being configured for transmitting radiofrequency electrical signals between the control module and the antenna, the control module being configured for communicating with the centralization device by radiofrequency communications via the antenna.

5. The radiofrequency device according to claim 3, wherein the first electrical voltage is greater than or equal to 24 volts.

6. The radiofrequency transmission line according to claim 1, in which each first capacitor and each second capacitor has a capacitance greater than or equal to 10 picofarads.

7. The radiofrequency transmission line according to claim 6, in which the main conductor further comprises at least two third portions and at least one third capacitor having a capacitance less than or equal to 50 picofarads, the third capacitor being inserted between the two third portions and including a fifth electrode electrically connected to one of the third portions and a sixth electrode electrically connected to the other third portion.

8. The radiofrequency transmission line according to claim 6, in which each first capacitor and each second capacitor has a capacitance in a range between 10 picofarads and 4.7 nanofarads.

9. The radiofrequency transmission line according to claim 1, further comprising at least one voltage clipping circuit configured for limiting, in absolute value, a difference of electrical potential between the main conductor and the ground plane.

10. The radiofrequency transmission line according to claim 9, in which each voltage clipping circuit comprises a first connection terminal electrically connected to a second portion of the main conductor and a second connection terminal electrically connected to the ground plane.

11. The radiofrequency transmission line according to claim 1, comprising a substrate having two mounting faces parallel to one another, each first capacitor of the main conductor being mounted on one of the mounting faces, each second capacitor of the ground plane being mounted on the other mounting face, each mounting face being perpendicular to a direction normal to the substrate, each first capacitor of the main conductor being aligned in the normal direction with a corresponding second capacitor of the ground plane.

* * * * *